(12) United States Patent
Jiang et al.

(10) Patent No.: US 11,374,190 B2
(45) Date of Patent: Jun. 28, 2022

(54) LIGHT-EMITTING DEVICE HAVING SURFACE-TREATED HOLE TRANSPORT LAYER AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Pei Jiang, Shenzhen (CN); Chiayu Lee, Shenzhen (CN); Chunche Hsu, Shenzhen (CN); Shujhih Chen, Shenzhen (CN); Miao Duan, Shenzhen (CN); Yongming Yin, Shenzhen (CN); Yongwei Wu, Shenzhen (CN); Bo He, Shenzhen (CN)

(*) Notice: Subject to any disclaimer, the term of this patent is extended or adjusted under 35 U.S.C. 154(b) by 163 days.

(21) Appl. No.: 16/626,540

(22) PCT Filed: Dec. 18, 2019

(86) PCT No.: PCT/CN2019/126231
§ 371 (c)(1),
(2) Date: Dec. 25, 2019

(87) PCT Pub. No.: WO2021/103208
PCT Pub. Date: Jun. 3, 2021

(65) Prior Publication Data
US 2021/0336174 A1     Oct. 28, 2021

(30) Foreign Application Priority Data
Nov. 25, 2019  (CN) .......................... 201911166762.8

(51) Int. Cl.
*H01L 29/08*  (2006.01)
*H01L 51/50*  (2006.01)
*H01L 51/56*  (2006.01)

(52) U.S. Cl.
CPC ...... *H01L 51/5056* (2013.01); *H01L 51/5072* (2013.01); *H01L 51/56* (2013.01)

(58) Field of Classification Search
CPC .................................................. H01L 51/5056
See application file for complete search history.

(56) References Cited

U.S. PATENT DOCUMENTS

| | | | |
|---|---|---|---|
| 2002/0113241 A1* | 8/2002 | Kubota | H05B 33/04 257/79 |
| 2005/0170211 A1* | 8/2005 | Fujioka | H01L 51/506 428/690 |

(Continued)

FOREIGN PATENT DOCUMENTS

| | | |
|---|---|---|
| CN | 106459639 A | 2/2017 |
| CN | 107112422 A | 8/2017 |

(Continued)

OTHER PUBLICATIONS

Enhancement of electrical conductivity of poly(3,4-ethylenedioxythiophene)/poly(4-styrenesulfonate) by a change of solvents; J.Y.Kim J.H.Jung D.E.Lee J.Joo; Synthetic Metals vol. 126, Issues 2-3, Feb. 14, 2002, pp. 311-316.

(Continued)

*Primary Examiner* — Caleb E Henry

(57) ABSTRACT

A present application provides a light-emitting device and a method of manufacturing the same. The light-emitting device includes an anode, a hole transport layer, a light-emitting layer, an electron transport layer, and a cathode all laminated together. The hole transport layer is treated with a high boiling point polar solution to reduce a Coulomb (Continued)

force of the hole transport layer. The light-emitting device of the present application can improve light-emitting efficiency of the light-emitting device.

16 Claims, 4 Drawing Sheets

(56) References Cited

U.S. PATENT DOCUMENTS

| | | | | |
|---|---|---|---|---|
| 2007/0187675 | A1* | 8/2007 | Lee | H01L 51/0043 257/40 |
| 2008/0264475 | A1* | 10/2008 | Ito | H01L 51/4253 136/252 |
| 2008/0286445 | A1* | 11/2008 | Suzuki | H01L 51/0072 427/64 |
| 2009/0317539 | A1* | 12/2009 | Shitagaki | C07D 209/86 427/66 |
| 2011/0284825 | A1* | 11/2011 | Yang | H01L 51/5048 257/40 |
| 2013/0276886 | A1* | 10/2013 | Worfolk | H01L 51/4253 136/263 |
| 2013/0320307 | A1* | 12/2013 | Birnstock | H01L 51/5048 257/40 |
| 2014/0332794 | A1* | 11/2014 | Birnstock | H01L 51/5268 257/40 |
| 2015/0214500 | A1 | 7/2015 | Helander et al. | |
| 2017/0121549 | A1 | 5/2017 | Kim | |
| 2017/0125713 | A1* | 5/2017 | Tokuda | H01L 51/444 |
| 2017/0346031 | A1* | 11/2017 | Lee | H01L 51/5096 |
| 2018/0040769 | A1* | 2/2018 | Gao | H01L 33/005 |
| 2018/0233688 | A1* | 8/2018 | Chen | H01L 51/50 |
| 2018/0248135 | A1* | 8/2018 | Yu | H01L 51/0023 |
| 2018/0261396 | A1* | 9/2018 | Gotanda | H01L 51/0047 |
| 2018/0277309 | A1* | 9/2018 | Etgar | H01L 51/0077 |
| 2019/0259961 | A1* | 8/2019 | Congreve | H05B 33/14 |
| 2020/0044176 | A1* | 2/2020 | Xu | H01L 51/5221 |
| 2020/0075878 | A1 | 3/2020 | Jiang et al. | |

FOREIGN PATENT DOCUMENTS

| | | |
|---|---|---|
| CN | 108649144 A | 10/2018 |
| CN | 108767123 A | 11/2018 |
| CN | 108922979 A | 11/2018 |
| CN | 109119450 A | 1/2019 |
| CN | 110350096 A | 10/2019 |

OTHER PUBLICATIONS

Comparison of dimethyl sulfoxide treated highly conductive poly(3,4-ethylenedioxythiophene):poly(styrenesulfonate) electrodes for use in indium tin oxide-free organic electronic photovoltaic devices; N.K.Unsworthal.HancoxaC.Argent DeardenaP.SullivanaM.WalkerbR.S.LilleycJ.Sharpc; Organic Electronics vol. 15, Issue 10, Oct. 2014, pp. 2624-2631.

* cited by examiner

LIGHT-EMITTING DEVICE HAVING SURFACE-TREATED HOLE TRANSPORT LAYER AND MANUFACTURING METHOD THEREOF

BACKGROUND OF INVENTION

1. Field of Invention

The present invention relates to a technical field of displays, and particularly to, a light-emitting device of a display panel and a method of manufacturing the same.

2. Related Art

In current light-emitting devices, due to low electrical conductivity of hole transport layers, a transmission rate of the hole transport layers is limited, giving rise to an imbalance between an injection rate and a transport rate of electrons and holes, thereby significantly reducing light-emitting efficiency of the light-emitting deices.

SUMMARY OF INVENTION

The present application is mainly directed to overcome a problem that a transmission rate of hole transport layers is limited due to low electrical conductivity of the hole transport layers, thereby giving rise to an imbalance between an injection rate and a transmission rate of electrons and holes.

In a first aspect, the present application provides a light-emitting device, comprising an anode, a hole transport layer, a light-emitting layer, an electron transport layer, and a cathode all laminated together; wherein the hole transport layer is treated with a high boiling point polar solution to reduce a Coulomb force of the hole transport layer, and a roughened structure is disposed on a surface of the hole transport layer facing the light-emitting layer, wherein the roughened structure has a thickness between 30 nanometers (nm) and 50 nm.

In the light-emitting device of the present application, the hole transport layer comprises 3,4-ethylene dioxythiophene monomer and polystyrene sulfonate, wherein the hole transport layer is treated with the high boiling point polar solution to reduce a Coulomb force between 3,4-ethylene dioxythiophene monomer and polystyrene sulfonate.

In the light-emitting device of the present application, the surface of the hole transport layer facing the light-emitting layer comprises a plurality of first areas and a plurality of second areas, wherein the first areas are provided with 3,4-ethylene dioxythiophene monomer, the second areas are provided with polystyrene sulfonate, and a sum of number of the first areas is greater than a sum of number of the second areas.

In the light-emitting device of the present application, a sum of area of the first areas is greater than a sum of area of the second areas.

In the light-emitting device of the present application, the high boiling point polar solution is a dimethylformamide solution, a butyrolactone solution, or a dimethylsulfoxide solution.

In the light-emitting device of the present application, the light-emitting layer comprises a material of perovskite.

In the light-emitting device of the present application, the roughened structure comprises a plurality of bumps spaced apart from each other, and adjacent two of the bumps are spaced at a distance between 1 nm and 3 nm.

In a second aspect, light-emitting device, comprising an anode, a hole transport layer, a light-emitting layer, an electron transport layer, and a cathode all laminated together; wherein the hole transport layer is treated with a high boiling point polar solution to reduce a Coulomb force of the hole transport layer.

In the light-emitting device of the present application, the hole transport layer comprises 3,4-ethylene dioxythiophene monomer and polystyrene sulfonate, and the hole transport layer is treated with the high boiling point polar solution to reduce a Coulomb force between 3,4-ethylene dioxythiophene monomer and polystyrene sulfonate.

In the light-emitting device of the present application, a surface of the hole transport layer facing the light-emitting layer comprises a plurality of first areas and a plurality of second areas, wherein the first areas are provided with 3,4-ethylene dioxythiophene monomer, the second areas are provided with polystyrene sulfonate, and a sum of number of the first areas is greater than a sum of number of the second areas.

In the light-emitting device of the present application, a sum of area of the first areas is greater than a sum of area of the second areas.

In the light-emitting device of the present application, the high boiling point polar solution is a dimethylformamide solution, a butyrolactone solution, or a dimethylsulfoxide solution.

In the light-emitting device of the present application, the hole transport layer has a thickness between 30 nanometers (nm) and 50 nm.

In the light-emitting device of the present application, the light-emitting layer comprises a material of perovskite.

In the light-emitting device of the present application, a roughened structure is disposed on a surface of the hole transport layer facing the light-emitting layer.

In the light-emitting device of the present application, the roughened structure comprises a plurality of bumps spaced apart from each other, and adjacent two of the bumps are spaced at a distance between 1 nm and 3 nm.

In a third aspect, the present application provides a method of manufacturing a light-emitting device, comprising providing an anode; forming a hole transport layer on the anode; performing a surface treatment on a surface of the hole transport layer away from the anode with a high boiling point polar solution; and forming an electron transport layer and a cathode in turn on the surface of the hole transport layer away from the anode.

The present application has advantageous effects as follows: the hole transport layer is treated with the high boiling point polar solution to reduce the Coulomb force of the hole transport layer, so that light-emitting efficiency of the light-emitting device can be improved.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
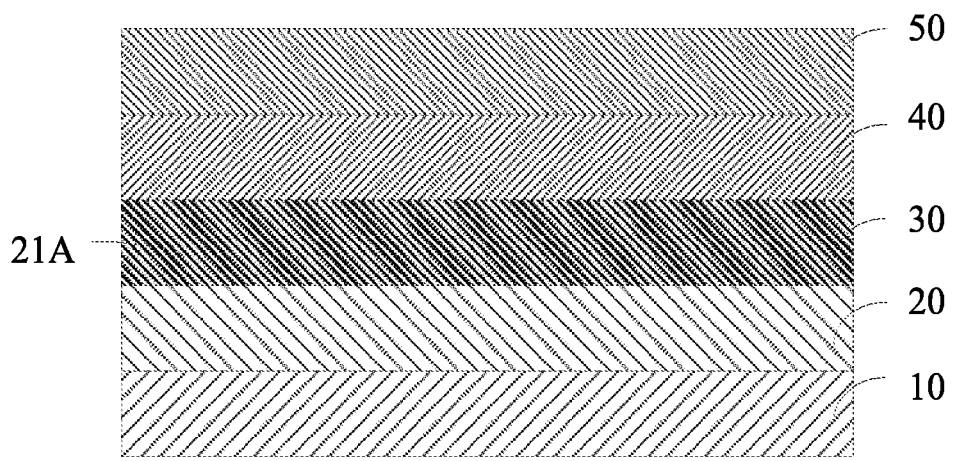
FIG. 1 is a schematic structural view of a light-emitting device in accordance with a first embodiment of the present application.

The embodiments of the present application are described in detail below, and examples of the embodiments are shown in the drawings, wherein the same or similar reference numerals indicate the same or similar elements or elements having the same or similar functions throughout. The embodiments described below with reference to the drawings are exemplary and are only used to explain the present application, and should not be construed as limiting the present application.

Please refer to FIG. 1 showing a schematic structural view of a light-emitting device in accordance with a first embodiment of the present application. The present application provides a light-emitting device 1, including an anode 10, a hole transport layer 20, a light-emitting layer 30, an electron transport layer 40, and a cathode 50 all laminated together. The hole transport layer is treated with a high boiling point polar solution to reduce a Coulomb interaction force of the hole transport layer 20.

Furthermore, the hole transport layer 20 includes 3,4-ethylene dioxythiophene monomer and polystyrene sulfonate. The hole transport layer is treated with the high boiling point polar solution to reduce a Coulomb force between 3,4-ethylene dioxythiophene monomer and polystyrene sulfonate. By reducing the Coulomb force between 3,4-ethylene dioxythiophene monomer and polystyrene sulfonate, electrical conductivity of the hole transport layer 20 is improved. That is, a hole transport rate of the hole transport layer 20 is increased, and light-emitting efficiency of the light-emitting device 1 is further improved.

Figure 2:
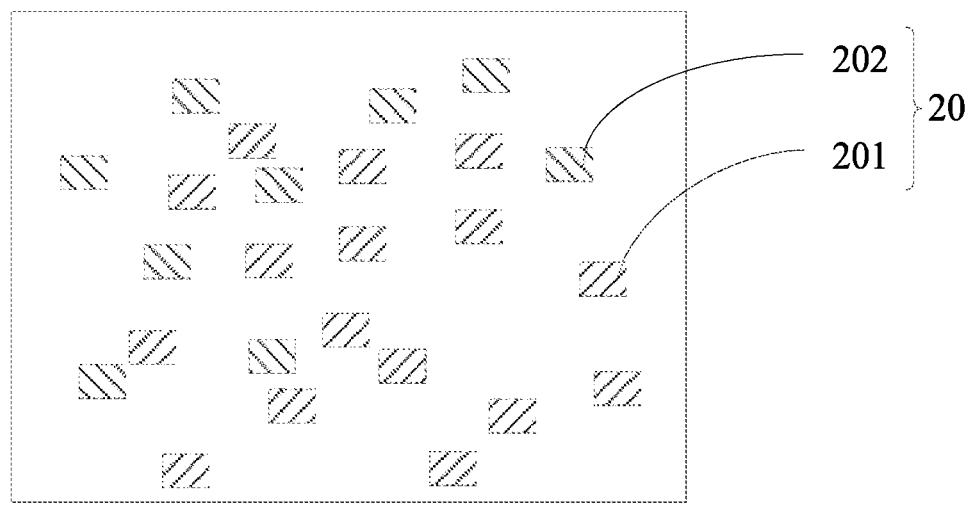
FIG. 2 is a schematic plan view of a hole transport layer facing a light-emitting layer of the light-emitting device of FIG. 1.

Please refer to FIG. 2 showing a schematic plan view of the hole transport layer facing the light-emitting layer of the light-emitting device of FIG. 1. A surface of the hole transport layer 20 facing the light-emitting layer 30 includes a plurality of first areas 201 and a plurality of second areas 202. The first areas 201 are provided with 3,4-ethylene dioxythiophene monomer, and the second areas are provided with polystyrene sulfonate. A sum of number of the first areas 201 is greater than a sum of number of the second areas 202. It should be noted that the hole transport layer 20 of the present application includes 3,4-ethylene dioxythiophene monomer and polystyrene sulfonate which are referred to as a conductive polymer. This conductive polymer is generally used as a main material of the hole transport layer 20 due to its excellent flexibility and extensibility. However, a Coulomb interaction between 3,4-ethylene dioxythiophene monomer and polystyrene sulfonate will affect electrical conductivity of the hole transport layer 20, thereby reducing the hole transport rate of the hole transport layer 20. But after the surface of the hole transport layer 20 facing the light-emitting layer 30 is treated with the high boiling point polar solution, 3,4-ethylene dioxythiophene monomer of the surface of the hole transport layer 20 facing the light-emitting layer 30 is more active than polystyrene sulfonate. That is, the Coulombforce between 3,4-ethylene dioxythiophene monomer and polystyrene sulfonate is reduced, and the sum of the number of the first areas 201 is greater than the sum of the number of the second areas 202. As a result, the hole transport rate of the hole transport layer 20 is increased, so that the light-emitting efficiency of the light-emitting device 1 is improved. Furthermore, a sum of area of the first areas 201 is greater than a sum of area of the second areas 202.

In certain embodiments, the high boiling point polar solution is a dimethylformamide solution, a butyrolactone solution, or a dimethylsulfoxide solution. For example, the present application may use the dimethylsulfoxide solution as the high boiling point polar solution of this application. The dimethylsulfoxide solution has characteristics of high dielectric constant, good thermal stability, and low toxicity, and therefore is suitable for large-scale industrial production.

In certain embodiments, the hole transport layer 20 has a thickness between 30 nanometers (nm) and 50 nm.

In certain embodiments, the light-emitting layer 30 includes a material of perovskite. Certainly, the light-emitting layer 30 may also be made of other materials. The application uses perovskite to further improve the light-emitting efficiency of the light-emitting device.

Figure 3:
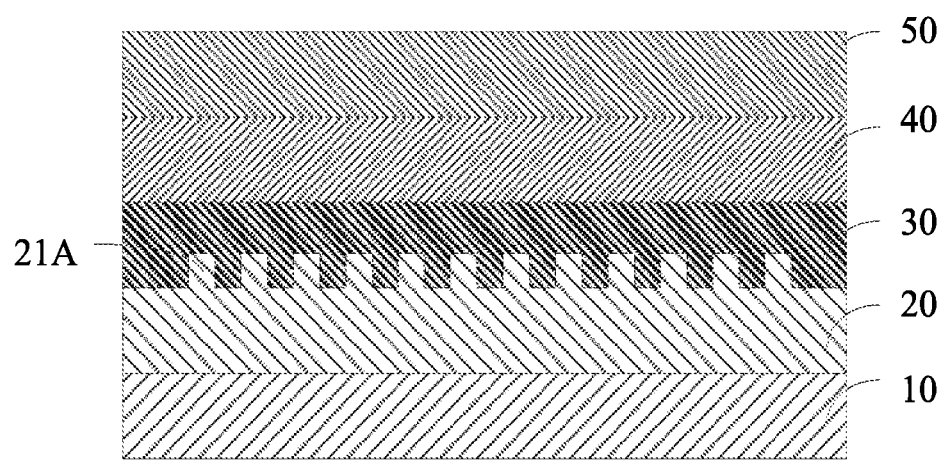
FIG. 3 is a schematic structural view of a light-emitting device in accordance with a second embodiment of the present application.

Please refer to FIG. 3. In certain embodiments, the surface of the hole transport layer 20 facing the light-emitting layer 30 is configured with a roughened structure. Furthermore, the roughened structure includes a plurality of bumps 21A spaced apart from each other, and adjacent two of the bumps 21A are spaced at a distance between 1 nm and 3 nm. For example, a distance between adjacent two of the bumps 21A may be 1.84 nm.

The hole transport layer 20 treated with the high boiling point polar solution to form the roughened structure on the surface of the hole transport layer 20 facing the light-emitting layer 30 can not only reduce the Coulomb force between 3,4-ethylene dioxythiophene monomer and polystyrene sulfonate, but also improve electrical conductivity of the hole transport layer 20, and further increase a contact area between the hole transport layer 20 and the light-emitting layer 30, thereby improving a binding capability between the hole transport layer 20 and the light-emitting layer 30, so that a product yield of the light-emitting device 1 is improved.

Figure 4:
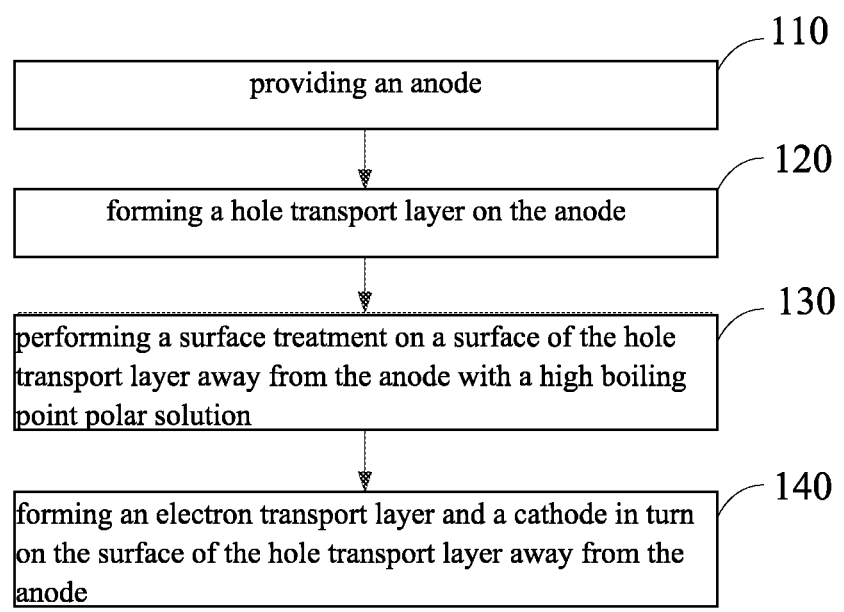
FIG. 4 is a flowchart showing a method of manufacturing a light-emitting device of the present application.

Accordingly, please refer to FIG. 4 showing a flowchart of a method of manufacturing a light-emitting device of the present application. The present application further provides a method of manufacturing a light-emitting device. The method includes:

Step 110: providing an anode.

Step 120: forming a hole transport layer on the anode.

Step 130: performing a surface treatment on a surface of the hole transport layer away from the anode with a high boiling point polar solution.

Step 140: forming an electron transport layer and a cathode in turn on the surface of the hole transport layer away from the anode.

Specifically, there is provided an anode already prepared. First, a surface of an anode 10 is coated with a solution containing 3,4-ethylene dioxythiophene monomer and polystyrene sulfonate. Then, the solution is thermally annealed by heating to form a hole transport layer 20 on the anode. Next, a surface of the hole transport layer 20 away from the anode 10 is treated with a high-polarity boiling point solution to reduce the Coulomb force between 3,4-ethylene dioxythiophene monomer and polystyrene sulfonate, and form a roughened structured on the surface of the hole transport layer 20 away from the anode 10. For example, 20 microliters of the high boiling point polar solution is added dropwise to the hole transport layer per square centimeter. After standing for one minute, the solution is annealed in air at a temperature of 150 degrees Celsius for 20 minutes. Then, ABX3 perovskite solution is prepared, wherein A is methylamine (MA+), formamidine (FA+), cesium (Cs+), or organic macromolecules, etc., B is lead (Pb2+), tin (Sn2+), etc., and X is halogen Chlorine (Cl—), bromine (Br—), iodine (I—), etc. Specifically, 0.4 millimoles (mmol) of phenylethylamine bromide, 0.06 mmol of methylamine chloride, 0.04 mmol of formamidine hydrobromide, and 0.6 mmol of lead bromide are dissolved in 1 ml of a dimethylsulfoxide solution to obtain perovskite precursor solution. Then, spin coat and deposit a perovskite light-emitting layer on the hole transport layer. Specifically, add 10 microliters of the perovskite precursor solution per square centimeter to the hole transport layer, add 300 microliters of chlorobenzene dropwise at 40 seconds, and anneal the hole transport layer for one hour under protection of nitrogen at an annealing temperature of 90 degrees Celsius. Finally, form an electron transport layer 40 and a cathode 50 in turn on the light-emitting layer 30.

Figure 5:
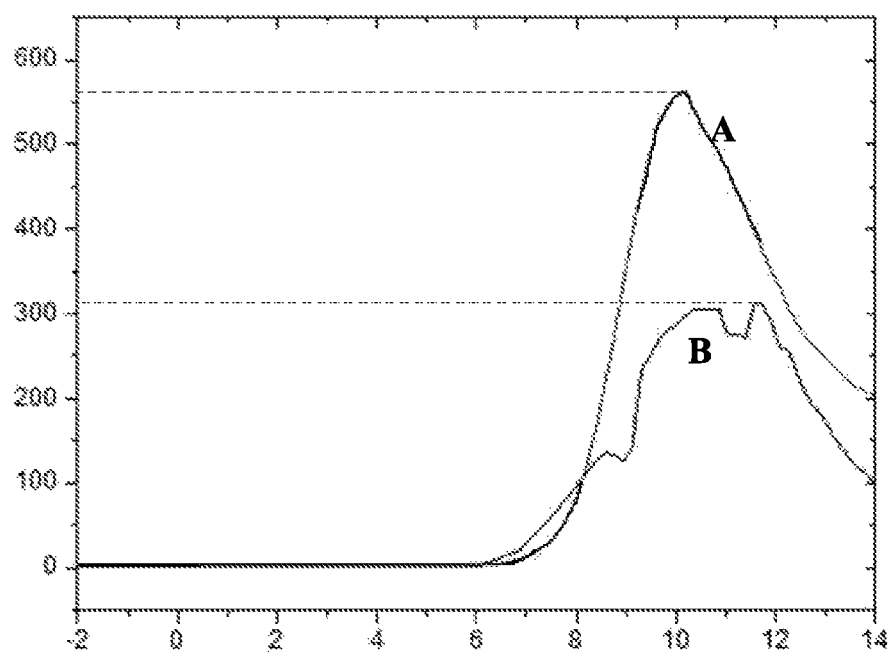
FIG. 5 is a test chart showing a maximum brightness of a light-emitting device of the present application.
Figure 6:
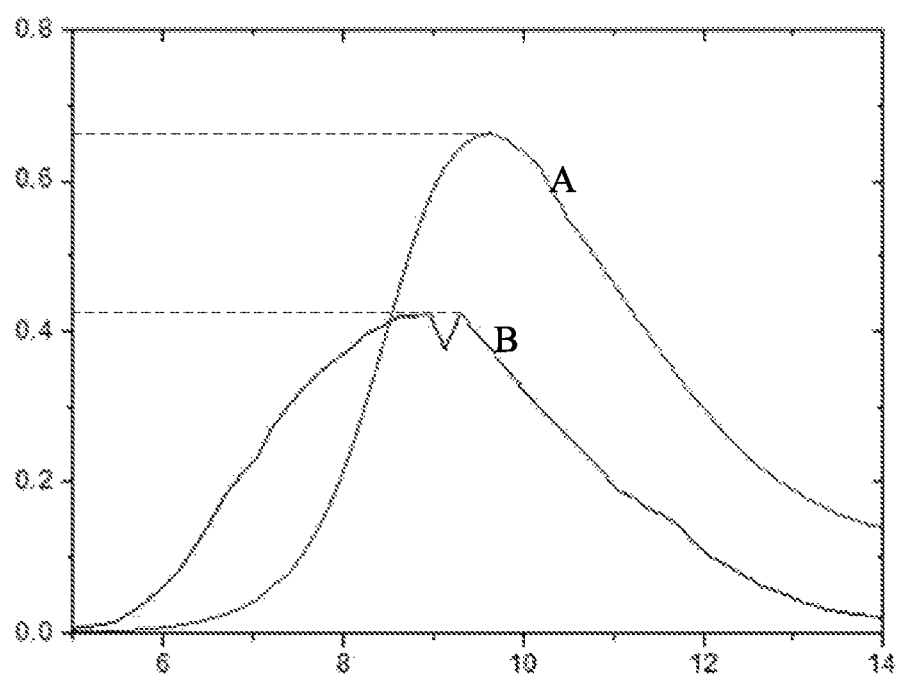
FIG. 6 is a test chart showing maximum current density of a light-emitting device of the present application.

Furthermore, please refer to FIGS. 5 and 6. FIG. 5 is a test chart showing maximum brightness of a light-emitting device of the present application. FIG. 6 is a test chart showing maximum current density of a light-emitting device of the present application. In FIG. 5, the line A indicates a light-emitting device of the present application, the line B indicates a general light-emitting device, a vertical axis indicates maximum brightness, and a horizontal axis indicates voltages. It can been seen that a maximum brightness of the light-emitting device of the present application can reach 562 candela per square meter, while a maximum brightness of a general light emitting device can only reach 306 candela per square meter. In FIG. 6, the line A indicates a light-emitting device of the present application, the line B indicates a general light-emitting device, a vertical axis indicates maximum current density, and a horizontal axis indicates voltages. It can been seen that a maximum current density of the light-emitting device of the present application can reach 0.66 candela per amp, while a maximum brightness of a general light emitting device can only reach 0.42 candela per amp.

It should be noted that prior to preparing the anode, a base substrate of the anode can also be preprocessed. That is, prior to providing the anode, the method further includes:

Step 21: providing a base substrate.

Step 22: preprocessing a surface of the base substrate to obtain the anode.

For example, specifically, the anode is made of an indium tin oxide (ITO) conductive glass. The conductive glass is subjected to deionized water operation. Then, ultrasonically clean the conductive glass with acetone and alcohol for 15 minutes, and finally the conductive glass is dried with nitrogen and is subjected to ultraviolet light irradiation for 10 minutes.

The present application provides a method of manufacturing a light-emitting device, including providing an anode, forming a hole transport layer on the anode, wherein the hole transport layer is completed by treating a surface of the hole transport layer away from the anode, and forming an electron transport layer and a cathode in turn on the hole transport layer. Perform a surface treatment on a surface of the hole transport layer facing the anode with a high boiling point polar solution to reduce a Coulomb force between 3,4-ethylene dioxythiophene monomer and polystyrene sulfonate. In this manner, a hole transport rate of the hole transport layer is increased, and light-emitting efficiency of the light-emitting device is further improved.

The light-emitting device and the method of manufacturing the same have been described in detail in the aforementioned embodiments of the present application. Specific examples are used in this article to explain the principle and implementation of this application. The descriptions of the above embodiments are only used to help understand the application. Those skilled in the art, according to the idea of the present application, can make changes in the specific implementation and scope of application. Accordingly, the content of this description should not be construed as a limitation on the present application.

What is claimed is:

1. A light-emitting device, comprising:
an anode, a hole transport layer, a light-emitting layer, an electron transport layer, and a cathode all laminated together;
wherein the hole transport layer is treated with a high boiling point polar solution to reduce a Coulomb force of the hole transport layer, and a roughened structure is disposed on a surface of the hole transport layer facing the light-emitting layer, wherein the roughened structure has a thickness between 30 nanometers (nm) and 50 nm.

2. The light-emitting device of claim 1, wherein the hole transport layer comprises 3,4-ethylene dioxythiophene monomer and polystyrene sulfonate, wherein the hole transport layer is treated with the high boiling point polar solution to reduce a Coulomb force between 3,4-ethylene dioxythiophene monomer and polystyrene sulfonate.

3. The light-emitting device of claim 2, wherein the surface of the hole transport layer facing the light-emitting layer comprises a plurality of first areas and a plurality of second areas, wherein the first areas are provided with 3,4-ethylene dioxythiophene monomer, the second areas are provided with polystyrene sulfonate, and a sum of number of the first areas is greater than a sum of number of the second areas.

4. The light-emitting device of claim 3, wherein a sum of area of the first areas is greater than a sum of area of the second areas.

5. The light-emitting device of claim 1, wherein the high boiling point polar solution is a dimethylformamide solution, a butyrolactone solution, or a dimethylsulfoxide solution.

6. The light-emitting device of claim 1, wherein the light-emitting layer comprises a material of perovskite.

7. The light-emitting device of claim 1, wherein the roughened structure comprises a plurality of bumps spaced apart from each other, and adjacent two of the bumps are spaced at a distance between 1 nm and 3 nm.

8. A light-emitting device, comprising:
an anode, a hole transport layer, a light-emitting layer, an electron transport layer, and a cathode all laminated together;
wherein the hole transport layer is treated with a high boiling point polar solution to reduce a Coulomb force of the hole transport layer, and the light-emitting layer comprises a material of perovskite.

9. The light-emitting device of claim 8, wherein the hole transport layer comprises 3,4-ethylene dioxythiophene monomer and polystyrene sulfonate, and the hole transport layer is treated with the high boiling point polar solution to reduce a Coulomb force between 3,4-ethylene dioxythiophene monomer and polystyrene sulfonate.

10. The light-emitting device of claim 9, wherein a surface of the hole transport layer facing the light-emitting layer comprises a plurality of first areas and a plurality of second areas, wherein the first areas are provided with 3,4-ethylene dioxythiophene monomer, the second areas are provided with polystyrene sulfonate, and a sum of number of the first areas is greater than a sum of number of the second areas.

11. The light-emitting device of claim 10, wherein a sum of area of the first areas is greater than a sum of area of the second areas.

12. The light-emitting device of claim 8, wherein the high boiling point polar solution is a dimethylformamide solution, a butyrolactone solution, or a dimethylsulfoxide solution.

13. The light-emitting device of claim 8, wherein the hole transport layer has a thickness between 30 nanometers (nm) and 50 nm.

14. The light-emitting device of claim 8, wherein a roughened structure is disposed on a surface of the hole transport layer facing the light-emitting layer.

15. The light-emitting device of claim 14, wherein the roughened structure comprises a plurality of bumps spaced apart from each other, and adjacent two of the bumps are spaced at a distance between 1 nm and 3 nm.

16. A method of manufacturing a light-emitting device, comprising:

providing an anode;

forming a hole transport layer on the anode;

performing a surface treatment on a surface of the hole transport layer away from the anode with a high boiling point polar solution; and forming an electron transport layer and a cathode in turn on the surface of the hole transport layer away from the anode.

* * * * *